(12) United States Patent
Yamaguchi et al.

(10) Patent No.: US 8,410,377 B2
(45) Date of Patent: Apr. 2, 2013

(54) MOUNTED STRUCTURE

(75) Inventors: Atsushi Yamaguchi, Osaka (JP); Hidenori Miyakawa, Osaka (JP); Shigeaki Sakatani, Osaka (JP); Koso Matsuno, Osaka (JP)

(73) Assignee: Panasonic Corporation, Osaka (JP)

( * ) Notice: Subject to any disclaimer, the term of this patent is extended or adjusted under 35 U.S.C. 154(b) by 123 days.

(21) Appl. No.: 12/260,219

(22) Filed: Oct. 29, 2008

(65) Prior Publication Data

US 2009/0116205 A1 May 7, 2009

(30) Foreign Application Priority Data

Nov. 1, 2007 (JP) ................................. 2007-284976

(51) Int. Cl.
*H01L 23/28* (2006.01)
(52) U.S. Cl. ......... 174/521; 257/724; 257/788; 257/738
(58) Field of Classification Search .................. 174/521, 174/534, 541; 257/724, 788, 738; 228/180.22
See application file for complete search history.

(56) References Cited

U.S. PATENT DOCUMENTS

| 5,520,752 A | 5/1996 | Lucey, Jr. et al. ............. 148/400 |
| 6,433,412 B2 | 8/2002 | Ando et al. .................... 257/678 |
| 6,550,665 B1 * | 4/2003 | Parrish et al. ............ 228/180.22 |
| 7,134,198 B2 * | 11/2006 | Nakatani et al. ................ 29/841 |
| 7,652,892 B2 * | 1/2010 | Shiu et al. ...................... 361/752 |
| 7,701,728 B2 * | 4/2010 | Hatanaka et al. ............. 361/800 |
| 2002/0046860 A1 * | 4/2002 | Xu et al. ......................... 174/521 |
| 2002/0195704 A1 * | 12/2002 | Chan et al. ..................... 257/724 |
| 2002/0195705 A1 * | 12/2002 | Terui et al. ..................... 257/724 |
| 2004/0120127 A1 * | 6/2004 | Hirose .......................... 361/760 |
| 2004/0195000 A1 * | 10/2004 | Ryhanen et al. .............. 174/260 |
| 2004/0253803 A1 | 12/2004 | Tomono et al. ................ 438/614 |
| 2005/0067177 A1 * | 3/2005 | Saito et al. ..................... 174/521 |
| 2005/0263880 A1 * | 12/2005 | Igarashi et al. ................ 257/723 |
| 2006/0065421 A1 | 3/2006 | Arai et al. ..................... 174/52.2 |

FOREIGN PATENT DOCUMENTS

| CN | 1755919 A | 4/2006 |
| JP | 10-163605 | 6/1998 |
| JP | 10-335390 | 12/1998 |
| JP | 11-177016 | 7/1999 |
| JP | 3027441 | 4/2000 |
| JP | 2001-267473 | 9/2001 |
| KR | 0605435 | 7/2006 |
| WO | WO 2007/018288 | 2/2007 |

* cited by examiner

*Primary Examiner* — Hung V Ngo
(74) *Attorney, Agent, or Firm* — Steptoe & Johnson LLP

(57) ABSTRACT

A plurality of semiconductor elements is adjacently mounted on a substrate by a solder with a melting point of 200° C. or lower, an electronic part other than the semiconductor elements is mounted on the substrate between the adjacently mounted semiconductor elements by a solder with a melting point of 200° C. or lower, and spaces between the plurality of semiconductor elements and the substrate, spaces between the electronic part and the substrate, and spaces between the plurality of semiconductor elements and the electronic part are integrally molded with a molding resin.

4 Claims, 4 Drawing Sheets

MOUNTED STRUCTURE

FIELD OF THE INVENTION

The present invention relates to a mounted structure in which a substrate is mounted with a semiconductor element and an electronic part other than the semiconductor element.

BACKGROUND OF THE INVENTION

Conventionally, as a bonding material for mounting a semiconductor element and an electronic part other than the semiconductor element, a Sn—Pb solder material containing lead, and in particular, a Sn—Pb eutectic solder material having a 63Sn—37Pb eutectic composition (a composition of 63% Sn and 37% Pb by weight) have been generally used.

A mounted structure using a solder material as a bonding material is shown in FIGS. 4A and 4B.

FIG. 4A is a plan view while FIG. 4B is a cross-sectional view taken along A-AA in FIG. 4A. A portion of FIG. 4B is shown enlarged. Semiconductor packages 2 such as BGA/LGAs (Ball Grid Array/Land Grid Arrays) and chip parts 3 other than a semiconductor package are mounted to a substrate 1 by a solder 5.

As junctions of semiconductor packages 2a and 2b become more minute, cracks are more likely to occur during temperature cycle tests and drop tests. Therefore, a molding structure has been adopted in which spaces between the substrate 1 are molded with a molding resin 4 to provide reinforcement. However, there has never been a case where the chip parts 3 are molded with the molding resin 4.

Furthermore, in recent years, lower profiles of the semiconductor packages 2a and 2b have given rise to demands for increased mechanical strength of soldered sections and improved reliability characteristics such as thermal-shock strength in regards to mounting the packages 2 on the substrate 1.

In response to environmental problems, bonding materials are also undergoing a transition to solder materials that do not include lead, i.e., lead-free solder materials. An example of a lead-free solder having two types of metals as primary components thereof is a Sn—Ag solder that is a eutectic alloy material (Patent Document 1, Patent Document 2).

However, the melting point of a Sn—Ag solder is approximately 30 to 40° C. higher than the melting point of a Sn—Pb solder (approximately 183° C.) and, in association therewith, the soldering temperature becomes higher as compared with a case where a Sn—Pb solder is used.

Therefore, the use of a Sn—Ag solder may give rise to situations where a mounting temperature at which the chip parts 3 are mounted on the substrate 1 exceeds the allowable temperature limit of the chip parts 3, which may disadvantageously cause damage to the chip parts 3. Currently, such a case imposes cumbersome solder processing including performing soldering while fitting the chip parts 3 with a protective jig so that the temperature of the chip parts 3 whose allowable temperature limit is lower than the mounting temperature does not exceed the allowable temperature limit, soldering the chip parts 3 with a low allowable temperature limit in a post-process, and the like.

Moreover, in response to demands for smaller sizes and lower profiles in electronic products, the profile of the substrate 1 has been also lower. Therefore, as the mounting temperature becomes higher, warpage of the substrate 1 occurs which disadvantageously degrades the bonding quality of the junction between the substrate 1 and the semiconductor packages 2a and 2b as well as the bonding quality of the junction between the substrate 1 and the chip part 3.

In consideration thereof, for the purpose of reducing or preventing thermal damage to the chip part 3, a conductive adhesive whose curing temperature is relatively lower than the melting point of a lead-free solder and a Sn—Bi solder having a low melting point have been drawing attention as alternative materials to such a solder (Patent Document 3).
[Patent Document 1] Japanese Patent No. 3027441
[Patent Document 2] U.S. Pat. No. 5,520,752
[Patent Document 3] Japanese Patent Laid-Open No. 10-163605

DISCLOSURE OF THE INVENTION

However, when mounting the chip part 3 onto the substrate 1 using low-temperature solders or conductive adhesives as described above, even with a mounted structure including the chip part 3 with a low allowable temperature limit, while fitting the protective jig or performing post-process soldering is no longer requisite, the inferior connection strength thereof as compared to a Sn—Ag solder has made it difficult to put low-temperature solders and conductive adhesives into practical use.

An object of the present invention is to provide a mounted structure capable of simplifying the solder processing using a low-temperature solder or a conductive adhesive as a bonding material, and improving junction quality.

In a mounted structure according to the present invention, a plurality of semiconductor elements is adjacently mounted on a substrate by a solder with a melting point of 200° C. or lower or by a conductive paste containing a solder with a melting point of 200° C. or lower as conductive particles, an electronic part other than the semiconductor elements is mounted on the substrate between the adjacently mounted semiconductor elements by a solder with a melting point of 200° C. or lower or by a conductive paste containing a solder with a melting point of 200° C. or lower as conductive particles, and spaces between the plurality of semiconductor elements and the substrate, spaces between the electronic part and the substrate, and spaces between the plurality of semiconductor elements and the electronic part are integrally molded with a molding resin.

Furthermore, the space between the adjacent semiconductor elements is set to 40 mm or less.

Furthermore, the composition of the solder includes at least one type of metal selected from Bi and In, and the balance of the composition is Sn.

Furthermore, the composition of the solder includes at least one type of metal selected from 50 to 70% Bi by weight and 10 to 25% In by weight, and the balance of the composition is Sn.

Furthermore, the composition of the solder further includes at least one type of metal selected from a group made up of Cu, Ge, and Ni.

Furthermore, the composition of the solder further includes at least one type of metal selected from a group made up of 0.1 to 1.0% Cu by weight, 0.001 to 0.1% Ge by weight, and 0.001 to 0.1% Ni by weight.

Furthermore, the thickness of the substrate is set to 0.5 mm or less.

Furthermore, the electronic part is mounted at the central position of the semiconductor elements adjacently mounted on the substrate.

In a mounted structure according to the present invention, a plurality of semiconductor elements is adjacently mounted on a substrate by a conductive adhesive, an electronic part other than the semiconductor elements is mounted on the substrate between the adjacently mounted semiconductor elements by a conductive adhesive, and spaces between the plurality of semiconductor elements and the substrate, spaces between the electronic part and the substrate, and spaces between the plurality of semiconductor elements and the electronic part are integrally molded with a molding resin.

With a mounted structure according to the present invention, even when an alloy with a relatively low melting point is used as a solder component by integrally molding an electronic part 3 and packages 2 with resin, the same bonding result can be obtained as a Sn—Ag—Cu solder, which is a representative lead-free solder.

According to the configuration described above, since the space between the electronic part and the substrate is molded with a molding resin, degradation in bonding quality of the electronic part can be prevented when a low-temperature solder or a conductive adhesive is used as a bonding material. At the same time, since the molding involves integrally molding the spaces between the plurality of semiconductor elements and the substrate, spaces between the electronic part and the substrate, and spaces between the plurality of semiconductor elements and the electronic part with a molding resin, even when a substrate with a thickness of 0.5 mm or less is used, the molding resin used for the integral molding is capable of providing reinforcement so as to prevent warpage of the substrate and is therefore effective in improving bonding quality when a low-temperature solder is used as a bonding material.

DESCRIPTION OF THE EMBODIMENTS

Respective embodiments of the present invention will now be described with reference to FIGS. 1A, 1B to 3.

First Embodiment

Figure 1A:
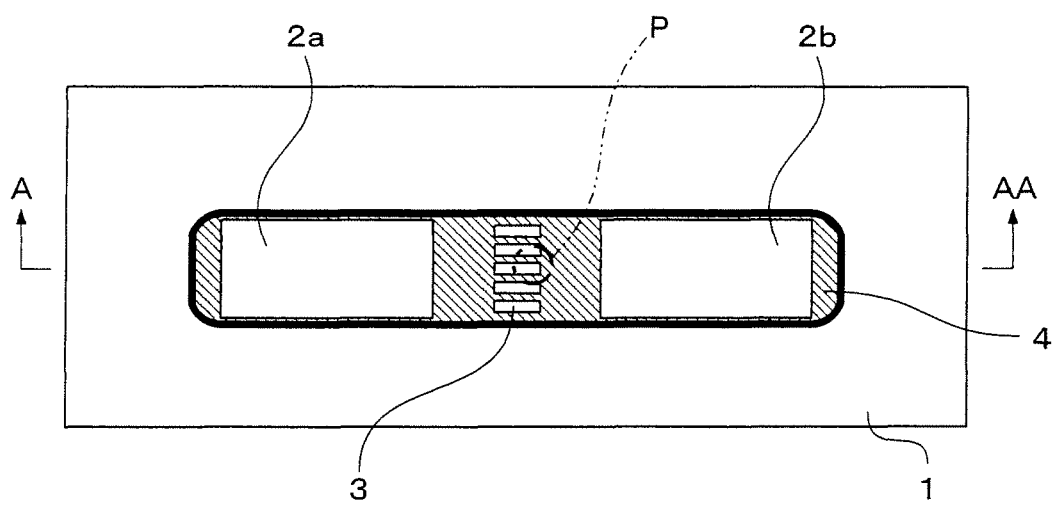
FIG. 1A is a plan view of a mounted structure according to the present invention.
Figure 1B:
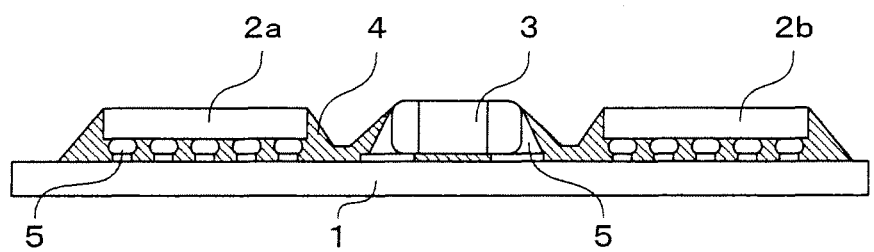
FIG. 1B is a cross-sectional view of the mounted structure according to the present invention.

FIGS. 1A and 1B show a first embodiment of the present invention.

FIG. 1A is a plan view while FIG. 1B is a cross-sectional view taken along A-AA in FIG. 1A. FIG. 1B is shown partially enlarged.

Semiconductor packages 2a and 2b as semiconductor elements and chip parts 3 as electronic parts other than the semiconductor elements are mounted on a substrate 1. The chip parts 3 are mounted between the two adjacently-disposed semiconductor packages 2a and 2b so as to fit within the widths of the semiconductor packages 2a and 2b. A molding resin 4 is provided so as to mold the two semiconductor packages 2a and 2b and the five chip parts 3. The semiconductor packages 2a and 2b and the chip parts 3 are mounted by a solder 5 onto the substrate 1. In this case, the chip parts 3 are mounted at the intermediate position of the semiconductor packages 2a and 2b.

As is apparent from FIG. 1B, spaces between the plurality of semiconductor packages 2a and 2b and the substrate 1, spaces between the chip parts 3 and the substrate 1, and spaces between the plurality of semiconductor packages 2a and 2b and the chip parts 3 are integrally molded with the molding resin 4.

The molding resin 4 is formed, after soldering is completed, by dropping a liquid-state molding resin using a dispenser (not shown) at a position of an application point P shown in FIG. 1B. More specifically, the dropped molding resin flows from lateral faces of the chip parts 3 and also flows smoothly into portions under the semiconductor packages 2a and 2b.

Since the molding resin 4 is supplied by setting the application point P to a position between the semiconductor packages 2a and 2b, the molding resin 4 can be poured uniformly between the semiconductor packages 2a and 2b and the substrate 1. Thus, a resin can be formed more simply, in a shorter time and in a shape more superior and uniform in comparison to a case where the molding resin 4 is supplied to the semiconductor packages 2a and 2b from different application points.

Using separate, e.g., two, application points may result in an inferior shape and an increase in defects, may affect adjacent parts, and may adversely cause an increase in resin volume cost as well as warpage of the substrate 1.

Compositions of the solder 5 used for mounting are shown in Table 1 presented below. Balances of the compositions are denoted as Bal.

The table shows compositions respectively corresponding to Examples 1 to 13. The table also shows measurements of the melting points of the solders. The melting points were measured using a differential thermal analyzer.

TABLE 1

| | SOLDER COMPOSITION [mass %] | | | | | | | MELTING POINT [° C.] | TEMPERATURE CYCLE LIFE (CYCLE) | |
| --- | --- | --- | --- | --- | --- | --- | --- | --- | --- | --- |
| | Sn | Ag | Bi | In | Cu | Ni | Ge | | WITHOUT MOLDING | WITH MOLDING |
| EXAMPLE 1 | Bal. | | 50 | 20 | | | | 105 | 500 | 1000 |
| EXAMPLE 2 | Bal. | | 50 | 24 | | | | 98 | 500 | 800 |
| EXAMPLE 3 | Bal. | | 52.5 | 17.5 | | | | 103 | 500 | 1000 |
| EXAMPLE 4 | Bal. | | 52.5 | 20 | | | | 98 | 500 | 800 |
| EXAMPLE 5 | Bal. | | 55 | 10 | | | | 110 | 500 | 1000 |
| EXAMPLE 6 | Bal. | | 55 | 17.5 | | | | 100 | 500 | 1000 |
| EXAMPLE 7 | Bal. | | 55 | 20 | | | | 96 | 400 | 800 |

TABLE 1-continued

| | SOLDER COMPOSITION [mass %] | | | | | | MELTING | TEMPERATURE CYCLE LIFE (CYCLE) | |
| --- | --- | --- | --- | --- | --- | --- | --- | --- | --- |
| | | | | | | | | WITHOUT | WITH |
| | Sn | Ag | Bi | In | Cu | Ni | Ge | POINT [° C.] | MOLDING | MOLDING |
| EXAMPLE 8 | Bal. | | 65 | 15 | | | | 99 | 400 | 800 |
| EXAMPLE 9 | Bal. | | 70 | 24 | | | | 70 | 400 | 800 |
| EXAMPLE 10 | Bal. | | 57 | 10 | | | | 115 | 500 | 1000 |
| EXAMPLE 12 | Bal. | | 57 | 15 | | | | 105 | 500 | 1000 |
| EXAMPLE 13 | Bal. | | 55 | 25 | | | | 85 | 400 | 800 |
| EXAMPLE 14 | Bal. | | 57 | 25 | | | | 80 | 400 | 800 |
| EXAMPLE 15 | Bal. | | 60 | 25 | | | | 79 | 400 | 800 |
| EXAMPLE 16 | Bal. | | 57 | 10 | 0.5 | | | 120 | 500 | 1000 |
| EXAMPLE 17 | Bal. | | 57 | 10 | | 0.01 | | 119 | 500 | 1000 |
| EXAMPLE 18 | Bal. | | 57 | 10 | | | 0.01 | 119 | 500 | 1000 |
| EXAMPLE 19 | Bal. | | 55 | 20 | 0.5 | | | 97 | 500 | 1000 |
| EXAMPLE 20 | Bal. | | 55 | 20 | | 0.01 | | 96 | 500 | 800 |
| EXAMPLE 21 | Bal. | | 55 | 20 | | | 0.01 | 96 | 500 | 800 |
| EXAMPLE 22 | Bal. | | 58 | | | | | 138 | 500 | 1000 |
| EXAMPLE 24 | Bal. | | | 52 | | | | 120 | 400 | 800 |
| COMPARATIVE EXAMPLE 1 | Bal. | 3 | | | 0.5 | | | 217 | 800 | — |

In addition, temperature cycle tests were performed as described below.

Figure 4A:
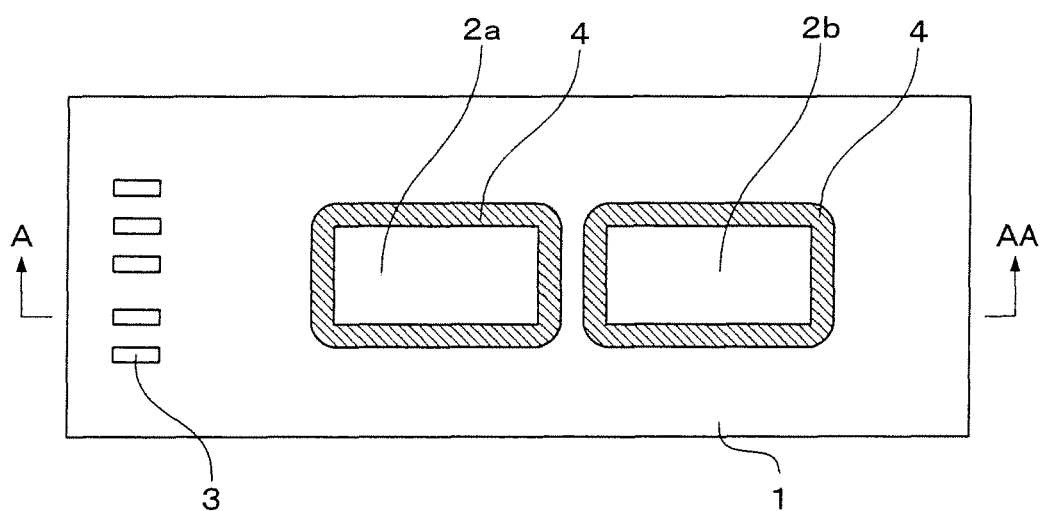
FIG. 4A is a plan view of a conventional mounted structure.
Figure 4B:
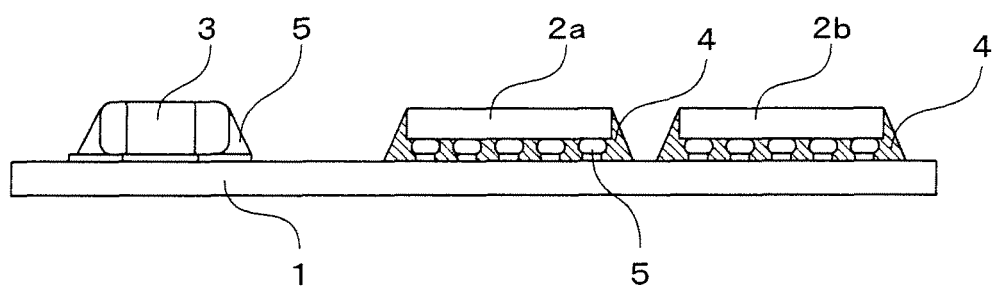
FIG. 4B is a cross-sectional view of the conventional mounted structure.

The solder materials shown in Table 1 were used in an arrangement as shown in FIGS. 1A and 1B to mount semiconductor packages 2a and 2b (10 by 10 mm squares with 1 mm thickness) at a 10 mm interval on the substrate 1 made of FR-4 glass-epoxy and having a thickness of 0.5 mm, and to mount five size 1005 chip parts 3 in a line between the semiconductor packages 2a and 2b. In a conventional arrangement, as shown in FIGS. 4A and 4B, the semiconductor packages 2a and 2b and the chip parts 3 were disposed in different regions.

Subsequently, the temperature cycle tests were performed between −40° C. and 125° C. (30 minutes each) and a comparison was performed among the numbers of cycles at which cracks occurred at the junction. As for the molding resin 4 used there, an underfill material: product number 1572 (viscosity: 0.65 Pas, elastic modulus: 3.0 GPa) manufactured by Namics Corporation, was used.

As is apparent from Table 1, adding Bi and In to Sn lowers the melting point as compared with a conventional Sn—Ag—Cu. In addition, compared to a conventional solder, temperature cycle characteristics when molding was not performed has deteriorated. When molding is performed on parts mounted by using Bi-and-In-added Sn solder with the molding resin 4, a favorable temperature cyclic performance can be obtained in comparison to a conventional Sn—Ag—Cu solder. In particular, temperature cycle characteristics are improved by molding chip parts 3 which have not been molded conventionally with the molding resin 4.

Thus, with a mounted structure on which mounting is performed using a Sn—Bi low-temperature solder, since the mounted parts including the chip part 3 were not molded in their entirety, the mechanical strength of the mounted structure was relatively low. Thus, an improvement in strength was requisite to the practical application of such arrangements. In contrast, even with a low-temperature solder with a melting point of 200° C. or less, by integrally molding the chip parts 3 together with the semiconductor packages 2a and 2b with the molding resin 4, the entire reliability of the substrate 1 is improved and a reliability is obtained which is equivalent to or greater than a mounted structure on which mounting is performed using a conventional Sn—Ag—Cu solder as a bonding material.

Temperature-cyclic performance is improved as described above because by molding the entire part-mounted portion of the substrate 1 with the molding resin 4, the junction is reinforced, warpage of the substrate 1 is suppressed by the molding, and the reliability of a low-temperature solder with a melting point of 200° C. or less can be improved. Compared to a case where the molding resin 4 is not entirely applied, by integrally performing molding with the molding resin 4, the differences in thermal expansion among the chip parts 3, the semiconductor packages 2a and 2b and the substrate 1 can be alleviated.

While size-1005 resistors have been used as the chip parts 3 in this case, parts disposed between the adjacent semiconductor packages 2a and 2b that are BGA/LGAs or the like can be any chip part as long as such a chip part can be disposed between the adjacent semiconductor packages 2a and 2b.

Bonding is ensured by integrally molding the semiconductor packages 2a and 2b and the chip parts 3 with the molding resin 4. A favorable arrangement of the semiconductor packages 2a and 2b and the chip parts 3 enables the molding resin 4 to spread readily. The molding resin 4 need not reach up to upper faces of the semiconductor packages 2a and 2b and to upper portions of the chip parts 3. Instead, molding of lateral and bottom faces shall suffice. In other words, the molding resin 4 need not exist on upper faces of the semiconductor packages 2a and 2b, and molding need only be performed on junctions between peripheral portions of the semiconductor packages 2a and 2b and the substrate 1 as well as on junctions between peripheries of the chip parts 3 and the substrate 1. As a result, the quantity of the molding resin 4 can be reduced to curb costs.

Moreover, while the semiconductor packages 2a and 2b such as BGA/LGAs were used as semiconductor elements, a non-packaged bare-state semiconductor element can also be used to achieve the same effects.

Furthermore, while a description has been given using the chip parts 3 that are resistors as the electronic parts other than the semiconductor elements, a capacitor, a coil or the like may be used instead.

As for solder compositions and bonding characteristics, while the mounted structure according to the present embodiment has used a solder material having a basic composition of Sn, Bi, and In and a melting point of 200° C. or less, a solder paste made by mixing conductive particles having a basic composition of Sn, Bi, and In into flux and which has a low melting point of 100° C. or less can be similarly used.

In regards to the present embodiment, the composition of the solder is an alloy composition containing at least one type of metal selected from Bi and In, and a balance of the composition is Sn. Bi and In are mixed in for the purpose of lowering the melting point of the alloy.

The content of Bi in the solder composition is favorably within 50 to 70% by weight, offering a significant increase in elongation and ensuring both a low melting point and high reliability. The Bi content is more favorably 52% or higher by weight and even more favorably 55% or higher by weight, and more favorably 57% or lower by weight and even more favorably 60% or lower by weight. The Bi content in the solder composition has been set to 50 to 70% by weight because a Bi content of under 50% by weight prevents the effect of a lower melting point from being sufficiently achieved while a Bi content of over 70% by weight reduces elongation.

The content of In in the solder composition is favorably within 10 to 25% by weight, offering a significant increase in elongation and ensuring both a low melting point and high reliability. The In content is more favorably 15% or higher by weight and even more favorably 20% or higher by weight, and more favorably 23% or lower by weight. The In content in the metallic composition has been set to 10 to 25% by weight because an In content of under 10% by weight prevents the effect of a lower melting point from being sufficiently achieved while an In content of over 25% by weight reduces elongation.

In addition to the basic composition described above, the solder composition according to the present embodiment can further include at least one type of metal selected from a group including Cu, Ge, and Ni. Cu, Ge, and Ni are added in order to improve the mechanical characteristics of the alloy.

The content of Cu in the solder composition is favorably within 0.1 to 1.0% by weight, and more favorably within 0.5 to 0.7% by weight. The Cu content among the conductive filler components has been set to 0.1 to 1.0% by weight because a Cu content of under 0.1% by weight prevents an effect with respect to the mechanical characteristics from being achieved while a Cu content of over 1.0% by weight manifests a tendency to make the alloy more brittle and therefore has an adverse effect on the mechanical characteristics.

The content of Ge in the solder composition is favorably within 0.001 to 0.1% by weight, and more favorably within 0.001 to 0.01% by weight. The Ge content among the metallic filler components has been set to 0.001 to 0.1% by weight because a Ge content of under 0.001% by weight prevents an effect with respect to the mechanical characteristics from being achieved while a Ge content of over 0.1% by weight rapidly raises the melting point of the alloy.

Ni is added to the solder components for the purpose of suppressing oxidation of Sn. The Ni content in the solder composition is favorably within 0.001 to 0.1% by weight, more favorably 0.005% or higher by weight, even more favorably 0.01% or higher by weight, still more favorably 0.05% or higher by weight, and even more favorably 0.1% or lower by weight. The Ni content in the solder composition has been set to 0.001 to 0.1% by weight because a Ni content of under 0.001% by weight prevents an effect of suppressing Sn oxidation from being achieved while a Ni content of over 0.1% by weight causes a formation of a strong Ni oxide film and raises the melting point, thereby preventing the effect of suppressing Sn oxidation from being achieved.

When adopting the above-described mounted structure having junctions which include a solder material capable of achieving a lower mounting temperature than a Sn—Ag solder, as shown in FIGS. 1A and 1B, a structure is adopted which achieves reinforcement by molding all of the junctions on the substrate 1. Consequently, even at a junction with a low melting point, a mounted structure with high reliability can be acquired.

Figure 2A:
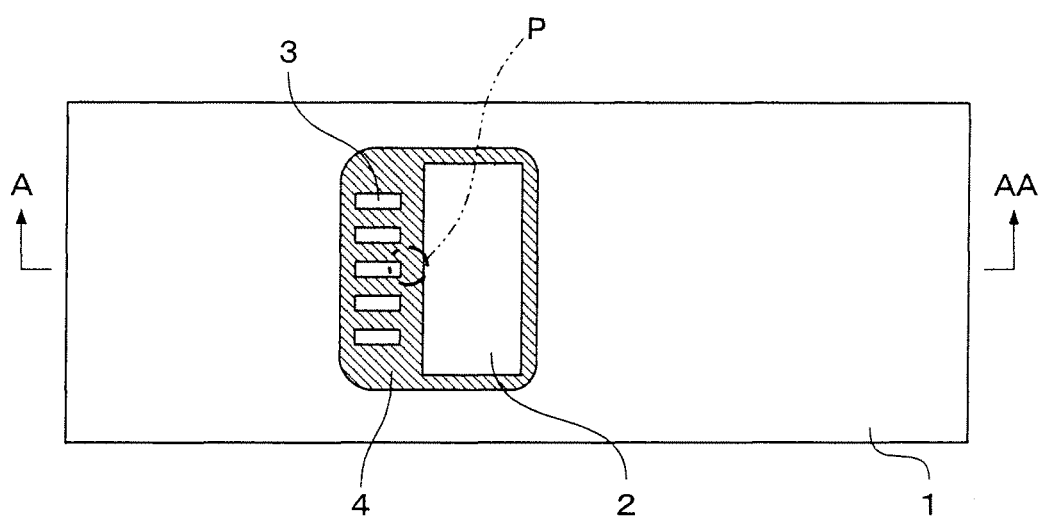
FIG. 2A is a plan view of another mounted structure according to the present invention.
Figure 2B:
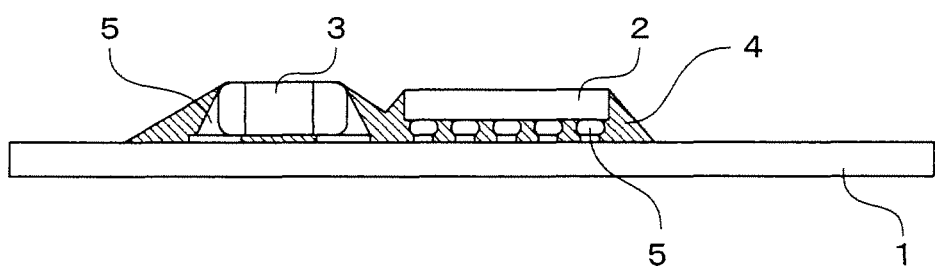
FIG. 2B is a cross-sectional view of this other mounted structure according to the present invention.
Figure 3:
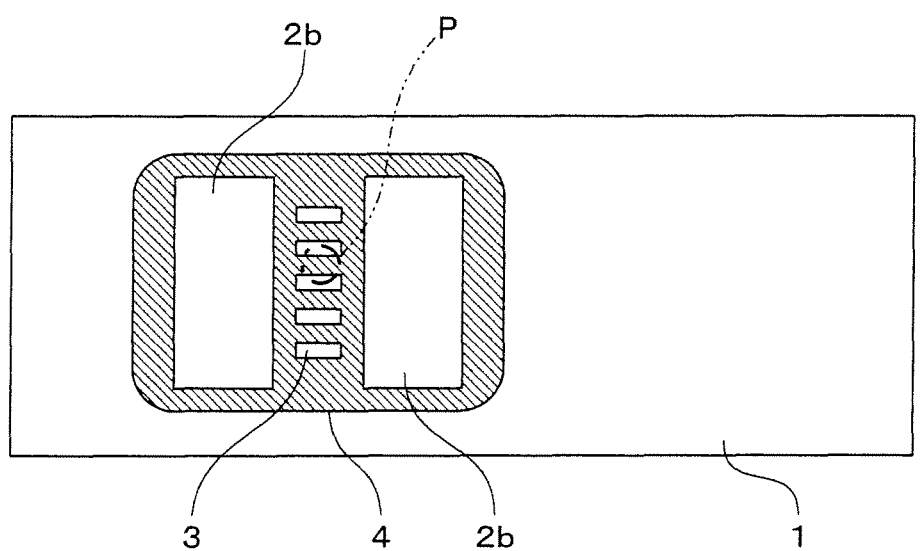
FIG. 3 is a plan view of yet another mounted structure according to the present invention.

A different arrangement of the present embodiment is shown in FIGS. 2A, 2B and 3.

FIG. 2A is a plan view of a case where there is one semiconductor element, and FIG. 2B is a cross-sectional view taken along A-AA of FIG. 2A. A semiconductor package 2 as the semiconductor element and a chip part 3 are disposed so as to form a rectangle. A position at which a molding resin 4 is to be applied is set at the center of the rectangle. The molding resin 4 spreads uniformly in a similar manner as in FIGS. 1A and 1B.

FIG. 3 shows a case where there are two semiconductor packages 2a and 2b. The difference from FIG. 1A is in the direction in which the packages 2 are disposed. As a whole, the semiconductor packages 2a and 2b are disposed so as to form a square. The arrangement shown in FIG. 1A is an elongated rectangle. The arrangement shown in FIG. 3 is a near square. An entire region of the semiconductor packages 2a and 2b and the chip part 3 is preferably disposed so that the lengths of the longitudinal and lateral sides are the same. The lengths of the longitudinal and lateral sides should have a ratio of at least 1:5 and favorably a ratio of 1:1.

In FIGS. 2A, 2B, and 3, the chip parts 3, the semiconductor package 2, and the semiconductor packages 2a and 2b are preferably disposed so as to form a concentric circle about an application point P. Consequently, the molding resin 4 spreads across the entirety, overall balance is improved, and warpage of the substrate 1 can be reduced.

Second Embodiment

In a second embodiment of the present invention, a temperature cycle life test was performed while varying the thickness of a substrate 1 in the embodiment shown in FIGS. 1A and 1B. The temperature cycle life test is the same as in the first embodiment. Results of the test are shown in Table 2 presented below. Table 2 shows temperature cycle characteristics in a case where the thickness of the substrate 1 is varied between 0.25 and mm.

TABLE 2

| | SOLDER COMPOSITION | | | SUBSTRATE | TEMPERATURE CYCLE LIFE (CYCLE) | | IMPROVEMENT RATE (MULTIPLE) |
|---|---|---|---|---|---|---|---|
| | [mass %] | | MELTING | THICKNESS | WITHOUT | WITH | WITH MOLDING/WITHOUT |
| | Sn | Bi | POINT [° C.] | [mm] | MOLDING | MOLDING | MOLDING |
| EXAMPLE 25 | 42 | 58 | 138 | 0.25 | 200 | 1000 | 5 |
| EXAMPLE 26 | 42 | 58 | 138 | 0.3 | 300 | 1000 | 3.3 |
| EXAMPLE 27 | 42 | 58 | 138 | 0.45 | 400 | 1000 | 2.5 |

TABLE 2-continued

| | SOLDER COMPOSITION [mass %] | | MELTING POINT [° C.] | SUBSTRATE THICKNESS [mm] | TEMPERATURE CYCLE LIFE (CYCLE) | | IMPROVEMENT RATE (MULTIPLE) |
|---|---|---|---|---|---|---|---|
| | Sn | Bi | | | WITHOUT MOLDING | WITH MOLDING | WITH MOLDING/WITHOUT MOLDING |
| EXAMPLE 28 | 42 | 58 | 138 | 0.5 | 500 | 1000 | 2 |
| COMPARATIVE EXAMPLE 2 | 42 | 58 | 138 | 0.65 | 600 | 1000 | 1.7 |
| COMPARATIVE EXAMPLE 3 | 42 | 58 | 138 | 0.8 | 600 | 1000 | 1.7 |

When the substrate 1 is thick, due to the robustness of the substrate 1 itself, warpage is unlikely to occur even if the temperature varies. With a mounted structure in which the thickness of the substrate 1 is 0.5 mm or less, a temperature variation causes warpage of the substrate 1, and merely performing mounting using a low-temperature solder with a melting point of 200° C. or less results in inferior bonding quality. Therefore, the absence of molding of the entirety with the molding resin 4 causes imperfect bonding and shortens product life. In contrast, with a thin mounted structure in which the thickness of the substrate 1 is 0.5 mm or less, in the case of the mounted structure according to the present invention in which the entirety is molded with the molding resin 4 as described above, imperfect bonding decreases and product life is extended in the same manner as in cases of a thick substrate 1 having a thickness of 0.65 or 0.8 mm even when mounting is performed in the same manner using a low-temperature solder with a melting point of 200° C. or less. Therefore, it is apparent that the present invention is effective with a mounted structure in which the thickness of the substrate 1 is 0.5 mm or less and, in particular, when the thickness of the substrate 1 is 0.45 mm or less. The present invention is also effective when using a low-temperature solder with a melting point of 180° C. or lower.

Third Embodiment

A third embodiment is an example concerning the distance between the semiconductor packages 2a and 2b shown in FIGS. 1A and 1B.

In FIGS. 1A and 1B, a Sn—Bi solder composition is used as the bonding material used in the second embodiment to mount chip parts 3 between a plurality of BGA/LGA semiconductor packages 2a and 2b in a part mounting region on the substrate 1. In this case, the chip parts 3 are mounted at an application point P on the substrate 1 between the adjacent semiconductor packages 2a and 2b. Table 3 presented below shows the result of varying distances between the semiconductor packages 2a and 2b in a case where a molding resin 4 is integrally applied to the semiconductor packages 2a and 2b and the chip parts 3.

TABLE 3

| | SOLDER COMPOSITION [mass %] | | MELTING POINT [° C.] | SUBSTRATE THICKNESS [mm] | PART | DISTANCE BETWEEN PACKAGES [mm] | PERMEABILITY |
|---|---|---|---|---|---|---|---|
| | Sn | Bi | | | | | |
| EXAMPLE 33 | 42 | 58 | 138 | 0.5 | 0.5 mm PITCH BGA, 1005 RESISTOR | 5 | G (GOOD) |
| EXAMPLE 34 | 42 | 58 | 138 | 0.5 | 0.5 mm PITCH BGA, 1005 RESISTOR | 10 | G (GOOD) |
| EXAMPLE 35 | 42 | 58 | 138 | 0.5 | 0.5 mm PITCH BGA, 1005 RESISTOR | 20 | G (GOOD) |
| EXAMPLE 36 | 42 | 58 | 138 | 0.5 | 0.5 mm PITCH BGA, 1005 RESISTOR | 30 | G (GOOD) |
| COMPARATIVE EXAMPLE 8 | 42 | 58 | 138 | 0.5 | 0.5 mm PITCH BGA, 1005 RESISTOR | 40 | A (AVERAGE) |
| COMPARATIVE EXAMPLE 9 | 42 | 58 | 138 | 0.5 | 0.5 mm PITCH BGA, 1005 RESISTOR | 50 | P (POOR) |
| COMPARATIVE EXAMPLE 10 | 42 | 58 | 138 | 0.5 | 0.5 mm PITCH BGA, 1005 RESISTOR | 60 | P (POOR) |
| COMPARATIVE EXAMPLE 11 | 42 | 58 | 138 | 0.5 | 0.5 mm PITCH BGA, 1005 RESISTOR | 70 | P (POOR) |

Table 3 shows that the molding resin 4 can be stably applied if the interval between the adjacent semiconductor packages 2a and 2b is 40 mm or less. However, disposing the semiconductor packages 2a and 2b over a greater distance causes the molding resin 4 to flow to an unnecessary portion or prevents the molding resin 4 from spreading sufficiently. Therefore, the molding resin 4 cannot be applied stably.

The molding resin 4 used herein is an underfill material: product number 1572 (viscosity: 0.65 Pas, elastic modulus: 3.0 GPa) manufactured by Namics Corporation. However, other molding resins 4 may similarly be used as long as the viscosity thereof is 2 Pas or lower.

A similar result is produced in FIG. 3. The distance between the semiconductor packages 2a and 2b is favorably 40 mm or less. A distance of 30 mm is even better. Similarly, in FIGS. 2A and 2B, the distance between the electronic parts 3 and the package 2 is favorably 30 mm or less.

The symbol "G (Good)" in Table 3 indicates that the molding resin 4 permeates all parts. "A (Average)" indicates a case where the shape of a fillet formed at the semiconductor packages 2a and 2b is insufficient. "P (Poor)" indicates a state where there are many parts to which the molding resin 4 has not permeated. In other words, "P (Poor)" indicates that the molding resin 4 does not permeate to a portion of the semiconductor packages.

In addition, in the case of a mounted structure where parts requiring molding are disposed in a region in the inside of a concentric circle about an application point P of the molding resin 4, the molding resin 4 can be applied simultaneously if the parts requiring molding are disposed in a region in the inside of the concentric circle with a radius of 30 mm or less about the application point P. However, with a part layout exceeding 30 mm, the parts cannot be simultaneously molded in a stable manner. In the case where the BGA/LGA type semiconductor packages 2a and 2b are to be mounted, a mounted structure is achieved which has a part layout where other parts are mounted at the application point P, and the molding resin 4 can be applied simultaneously with the semiconductor packages 2a and 2b.

In the case where a plurality of BGA/LGA type semiconductor packages 2a and 2b is mounted, if the interval between the adjacent semiconductor packages 2a and 2b is 20 mm or less, the molding resin 4 can be applied to the adjacent semiconductor packages 2a and 2b and to parts laid out therebetween in a stable manner. However, an interval of over 20 mm results in insufficient permeability of the molding resin 4 to the semiconductor packages 2a and 2b.

While the present embodiment has been described using a case where mounting is performed with a low-temperature solder as an example, the same effects can be expected in a case of a mounted structure in which mounting is performed with a conductive paste containing a solder with a melting point of 200° C. or less as conductive particles.

In addition, the same effects can also be expected in a case of a mounted structure in which mounting is performed with a conductive adhesive made up of resin and a conductive filler such as gold or silver and whose curing temperature is 200° C. or less.

In the respective embodiments described above, the molding resin 4 had not been used to cover the entirety of the semiconductor packages 2a and 2b as semiconductor elements and the entirety of the chip parts 3 as electronic parts other than the semiconductor elements. Instead, sufficient strength has been maintained merely by molding the lateral faces.

The present invention may be used for connecting electronic parts such as a CCD element, a hologram element, and a chip part, and for forming wiring for a substrate that bonds such electronic parts. As a result, the present invention may be used in products incorporating such elements, parts and/or substrates including a DVD, a mobile telephone, a portable AV device, a lap-top PC, a digital camera, a memory card, and the like.

What is claimed is:

1. A mounted structure comprising:
a semiconductor element mounted on a surface of a substrate by a solder composition having a melting point of 70 to 138° C. and comprising 50 to 70 wt % Bi, 10 to 25 wt % In, the balance of the solder composition being Sn;
a chip part different from the semiconductor element, mounted on the substrate by said solder composition; and
a unitary integral mass of molding resin in a first space between the semiconductor element and said surface, a second space between the chip part and said surface, and a third space on said surface of the substrate between the semiconductor element and the chip part, thereby integrally molding together the substrate, semiconductor element, and chip part.

2. The mounted structure according to claim 1, wherein the solder composition includes 0.001 to 0.1 wt % Ge.

3. The mounted structure according to claim 1, wherein the solder composition includes 0.001 to 0.1 wt % Ni.

4. A mounted structure comprising:
a semiconductor element mounted on a surface of a substrate by a solder composition having a melting point of 70 to 79° C. and comprising 60 to 70 wt % Bi, 15 to 25 wt % In, the balance of the solder composition being Sn;
a chip part different from the semiconductor element, mounted on said surface by said solder composition;
a first space between the semiconductor element and said surface, a second space between the chip part and said surface, and a third space on said surface of the substrate between the semiconductor element and the chip part which are integrally molded with a molding resin; and
a unitary integral mass of molding resin in a first space between the semiconductor element and said surface, a second space between the chip part and said surface, and a third space on said surface of the substrate between the semiconductor element and the chip part, thereby integrally molding together the substrate, semiconductor element, and chip part.

* * * * *